US011769686B2

(12) United States Patent
Reddy et al.

(10) Patent No.: US 11,769,686 B2
(45) Date of Patent: Sep. 26, 2023

(54) METHODS AND APPARATUS FOR ELECTROLESS PLATING DISPENSE

(71) Applicant: Intel Corporation, Santa Clara, CA (US)

(72) Inventors: Harinath Reddy, Hillsboro, OR (US); Harsono S. Simka, Saratoga, CA (US); Christopher D. Thomas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 950 days.

(21) Appl. No.: 16/330,365

(22) PCT Filed: Sep. 29, 2016

(86) PCT No.: PCT/US2016/054533
§ 371 (c)(1),
(2) Date: Mar. 4, 2019

(87) PCT Pub. No.: WO2018/063257
PCT Pub. Date: Apr. 5, 2018

(65) Prior Publication Data
US 2021/0375662 A1 Dec. 2, 2021

(51) Int. Cl.
*B05B 13/02* (2006.01)
*B05B 13/04* (2006.01)
(Continued)

(52) U.S. Cl.
CPC ........ *H01L 21/68764* (2013.01); *B05B 13/02* (2013.01); *B05B 13/0228* (2013.01);
(Continued)

(58) Field of Classification Search
USPC ......... 118/52, 612, 319, 320, 500, 323, 321, 118/679–681, 56
See application file for complete search history.

(56) References Cited

U.S. PATENT DOCUMENTS 6,207,352 B1 * 3/2001 Mutoh ................. G03F 7/3021
430/311
2002/0008036 A1 1/2002 Wang
(Continued)

OTHER PUBLICATIONS

International Preliminary Report on Patentability from PCT/US2016/054533 dated Apr. 11, 2019, 12 pgs.
(Continued)

*Primary Examiner* — Yewebdar T Tadesse
(74) *Attorney, Agent, or Firm* — Essential Patents Group, LLP

(57) ABSTRACT

A single-substrate electroless (EL) plating apparatus including a workpiece chuck that is rotatable about rotation axis and inclinable about an axis of inclination. The chuck inclination may be controlled to a non-zero inclination angle during a dispense of plating solution to improve uniformity in the surface wetting and/or plating solution residence time across the a surface of a workpiece supported by the chuck. The angle of inclination may be only a few degrees off-level with the plating solution dispensed from a nozzle that scans over a high-side of the chuck along a radius of the workpiece while the chuck rotates. The angle of inclination may be actively controlled during dispense of the plating solution. The inclination angle may be larger at commencement of the plating solution dispense than at cessation of the dispense.

19 Claims, 8 Drawing Sheets

(51) Int. Cl.
  *H01L 21/687* (2006.01)
  *C23C 18/16* (2006.01)
  *H01L 21/288* (2006.01)
  *H01L 21/67* (2006.01)

(52) U.S. Cl.
  CPC ............ *B05B 13/04* (2013.01); *C23C 18/163* (2013.01); *C23C 18/1642* (2013.01); *C23C 18/1675* (2013.01); *H01L 21/288* (2013.01); *H01L 21/6715* (2013.01)

(56) References Cited

U.S. PATENT DOCUMENTS

| | | | | |
|---|---|---|---|---|
| 2002/0036143 | A1* | 3/2002 | Segawa | C23C 18/1683 205/187 |
| 2003/0221612 | A1* | 12/2003 | Dai | H01L 21/67046 118/72 |
| 2004/0245112 | A1* | 12/2004 | Sekimoto | C25D 5/08 204/224 R |
| 2007/0131164 | A1 | 6/2007 | Park et al. | |
| 2008/0057211 | A1 | 3/2008 | Chen et al. | |
| 2008/0149489 | A1* | 6/2008 | Varadarajan | C25D 17/06 205/137 |
| 2010/0236579 | A1* | 9/2010 | Araki | H01L 21/67028 134/94.1 |
| 2010/0320356 | A1* | 12/2010 | Maillard | G02B 7/1824 248/278.1 |
| 2012/0160278 | A1 | 6/2012 | Higashijima et al. | |
| 2014/0245954 | A1 | 9/2014 | Minami et al. | |
| 2016/0307779 | A1* | 10/2016 | Chen | H01L 21/02282 |

OTHER PUBLICATIONS

International Search Report and Written Opinion from PCT/US2016/054533 dated Jun. 14, 2017, 15 pgs.

* cited by examiner

METHODS AND APPARATUS FOR ELECTROLESS PLATING DISPENSE

CLAIM OF PRIORITY

This Application is a National Stage Entry of, and claims priority to, PCT Application No. PCT/US2016/054533, filed on Sep. 29, 2016 and titled "METHODS & APPARATUS FOR ELECTROLESS PLATING DISPENSE", which is incorporated by reference in its entirety for all purposes.

BACKGROUND

Semiconductor manufacturing feature geometries continue to shrink with efforts to extend Moore's law for integrated circuitry (IC). With such dimensional reductions it has become more challenging to back-fill topographic features with deposited materials. One deposition technique is Electroless (EL) plating. In some single-substrate EL plating processes, a desired material (e.g., a metal such as Ni) is deposited onto a surface by dispensing a plating liquid onto the workpiece (e.g., a semiconductor wafer).

FIG. 1 illustrates a conventional single-wafer EL plating apparatus 101. As shown, workpiece 105 is disposed on a workpiece platen or chuck 110 that is coupled to a motorized drive shaft 115. A plating liquid 125 is dispensed through a dispense nozzle 120 while positioned either at some static location, or dynamically positioned (e.g., scanned), over some portion of the substrate surface as workpiece 105 is rotated about the chuck's rotational axis A. Rapid distribution of plating liquid puddle 131 evenly over the entire substrate surface is important, in part, because of the reactions that lead to material deposition. Such a deposition process is complex, requiring control over both mass transfer and heat transfer to the substrate. Hence, surface wetting rate and wetting uniformity can be more important for EL plating solution dispenses than for other liquid dispense processes, such as photoresist spin coating and spin-on glass processes, where cross-linking reactions may not be triggered until after the liquid dispense has completed, and a uniform puddle thickness has been achieved over the substrate surface.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
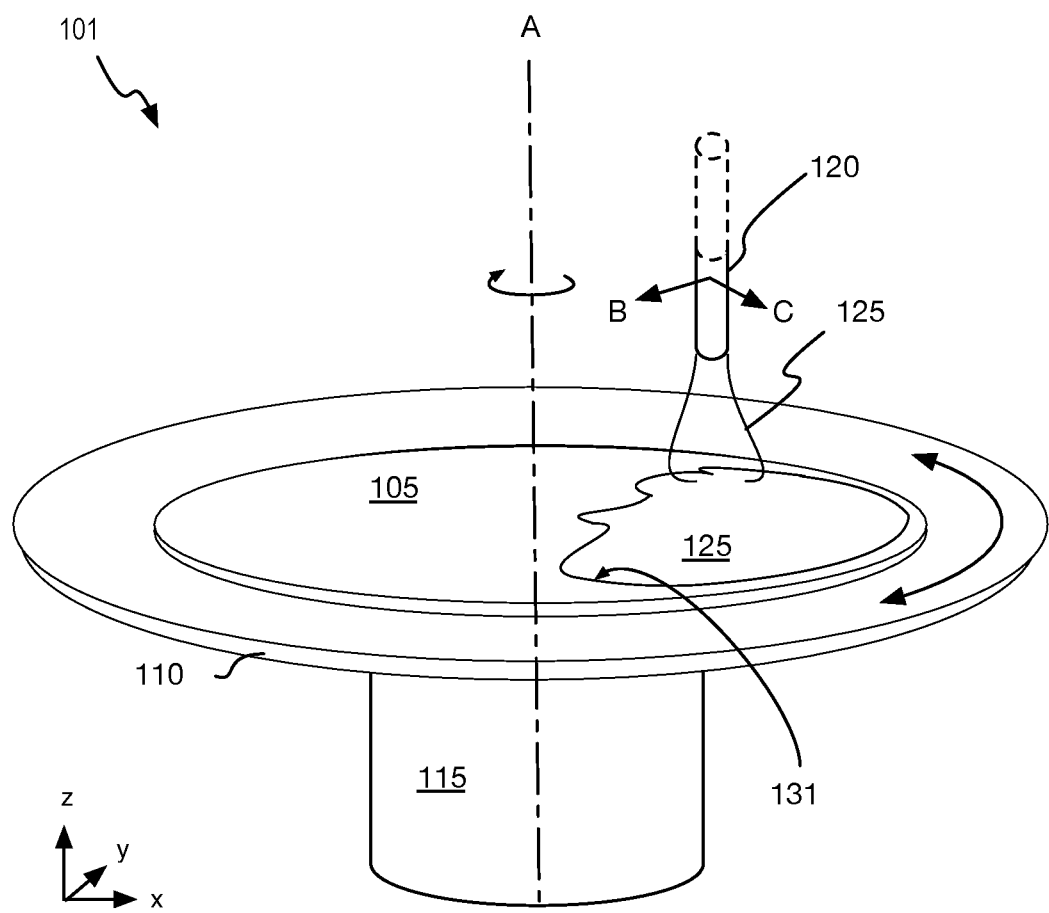
FIG. 1 is an isometric schematic illustrating a conventional electroless plating apparatus.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Certain portions of the material disclosed herein may be implemented in hardware, for example as logic circuitry in a processor responsible for controlling parameters of a EL plating process. Certain other portions may be implemented in hardware, firmware, software, or any combination thereof. At least some of the material disclosed herein may also be implemented as instructions stored on a machine-readable medium, which may be read and executed by one or more computer processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other similarly non-transitory, tangible media.

Through empirical testing and extensive computer simulation of a plating dispense process of the type implemented by EL plating apparatus 101, the inventors have determined that a significant portion of variation in plating rates and plated film thicknesses across the substrate is attributable to variation in the residence time of the plating liquid over different locations of the workpiece during the liquid dispense. The inventors have further discovered plating liquid residence time variation is a strong function of the rate at which the workpiece surface is wet by the plating liquid as residence time is accumulating in various wet locations prior to completely wetting the workpiece surface.

In further reference to FIG. 1, the EL plating process control parameters of plating apparatus 101 are limited to the dispense location as controlled by the position of nozzle 120 relative to rotational axis A during the dispense, the rate of the chuck rotation about rotational axis A during the dispense, and the flow rate of the plating liquid 125 during the dispense. The inventors have found residence time variation can be significantly reduced by preferentially directing the plating liquid from the "wet" dispense location to "dry" regions of the wafer. While it was determined that the chuck rotation rate can improve the rate at which the plating liquid is transported from the dispense location to other locations of the workpiece surface, increasing the rotation rate leads to a significant decrease in the plating rate, and can even preclude plating beyond a critical RPM. Exemplary rotation rates are therefore between 1 and 30 RPM, and advantageously less than 10 RPM. Potential defect/gap-fill issues have also attributed to high chuck rotation speeds, and although not bound by theory, the inventors currently understand the plating liquid lacks sufficient time to fill high aspect ratio features (e.g., trenches) under such conditions. Increasing the plating liquid flow rate also reduces the time required for the plating liquid to cover the wafer surface. However the dependency has been found to be fairly weak, limiting flow rate manipulation to fine tuning of a variation profile. Additionally, this approach is not cost efficient for processes with expensive plating solution mixtures, or environmentally friendly for hazardous plating solutions, as the solution usage efficiency decreases with higher dispense rates.

Hence, nozzle dispense location during the dispense has been found to be the primary EL plating process control parameter in plating apparatus 101 for reducing plating liquid residence time variation. Optimization of the EL plating process then relies on dispensing the plating liquid at different locations with each individual dispense location yielding a certain variation profile across the substrate surface. However, for certain plating processes, the degree of uniformity attained via nozzle dispense location optimization may be insufficient to meet the process specifications, rendering plating apparatus 101 incapable of performing the process within specification.

As described further below in the context of some exemplary embodiments, a single-wafer electroless (EL) plating apparatus includes a workpiece chuck that is further operable to tilt or incline about an axis of inclination. The chuck inclination may be controlled to a non-zero inclination angle to improve uniformity in the surface wetting and/or plating solution residence time across the a surface of a substrate supported by the chuck. The angle of inclination may be controlled to be only a few degrees off-level (e.g., 1°-5°) with the plating solution dispensed from a nozzle positioned over a high-side of the chuck along a radius of the substrate while the chuck rotates. The angle of chuck inclination may be actively controlled during the dispense of the plating solution, either alone or in combination with control of the nozzle position and rotation speed. For example, the inclination angle may be larger upon commencement of the plating solution dispense than upon cessation of the solution dispense.

The inventors have found chuck (workpiece) tilt, as an additional process control parameter can provide a significant improvement in plated material thickness uniformity across the plated surface area even when enlisted in isolation of other parameters such as the dispense nozzle location. Simulation of the plating liquid puddle thickness also shows an improvement in liquid uniformity across the workpiece surface area. Another advantage is that provisions for controlling chuck tilt can be made in a relatively cost efficient manner as a fixed cost associated with a one-time hardware build/modification accompanied with an update to plating tool controller software.

Figure 2:
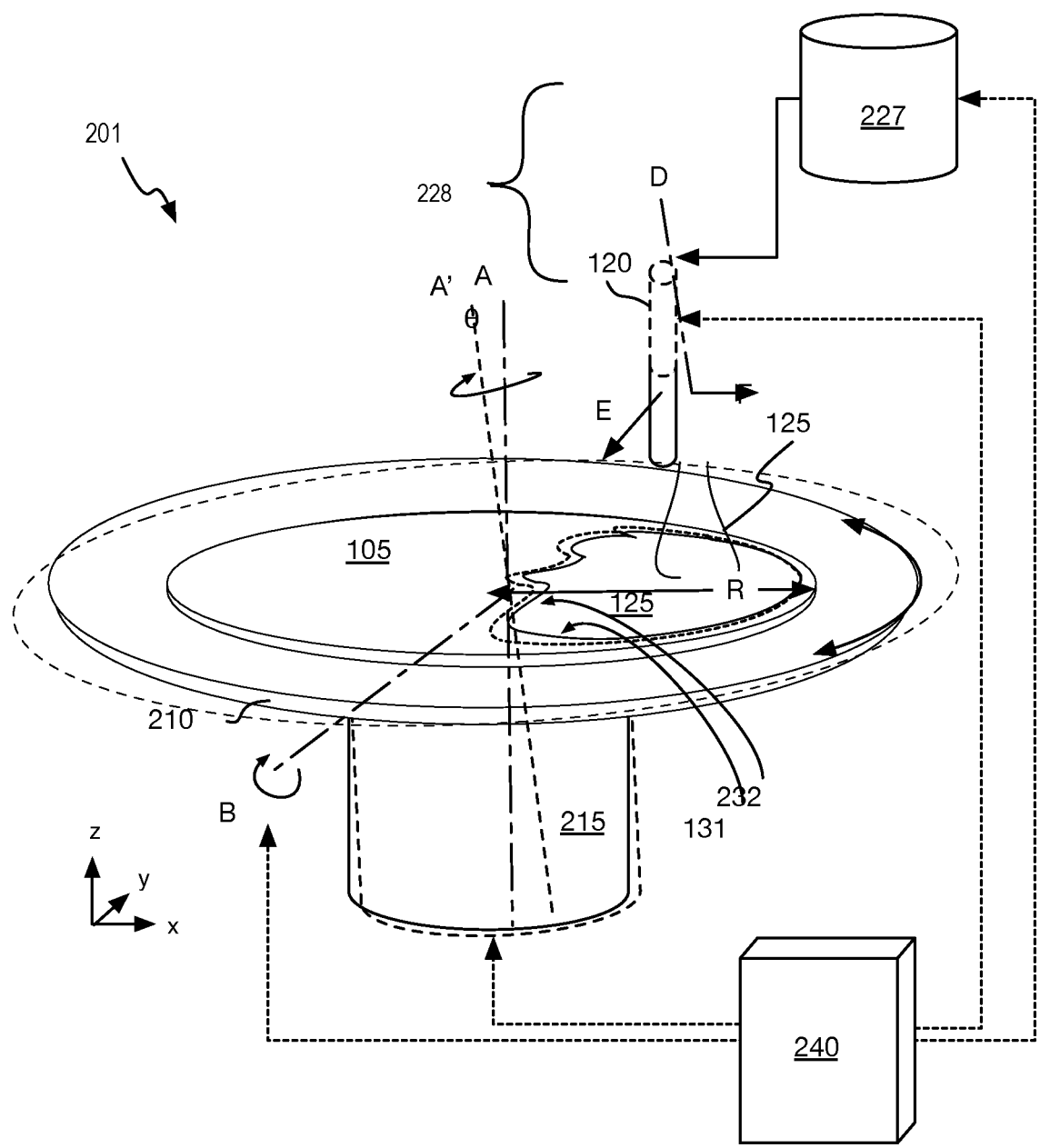
FIG. 2 is a schematic illustrating an electroless plating apparatus, in accordance with some embodiments.

FIG. 2 is a schematic illustrating an electroless plating apparatus 201, in accordance with some embodiments. As shown, workpiece 105 in the exemplary embodiments is a disk-shaped substrate, such as a semiconductor wafer, which is disposed on workpiece chuck 210. Chuck 210 is to support workpiece 105 during the EL plating process. Chuck 210 is mechanically coupled to a motorized drive shaft 215. Motorized drive shaft 215 is further supported by a suspension to a tool chassis (not depicted). A EL plating liquid 125 is dispensed through one or more dispense nozzle 120 while nozzle 120 is positioned either at a static location over workpiece 105, or dynamically positioned (e.g., scanned) over some portion of the substrate surface, as workpiece 105 is rotated about the chuck's rotational axis A. Dispense nozzle 120 is a component of a liquid delivery system 228 that further includes a liquid reagent reservoir 227 in fluid communication with nozzle 120 through plumbing. Liquid delivery system 228 may further include a flow rate control (not depicted), such as a metering pump, to control flow of plating liquid between reservoir 227 and nozzle 120. Dispense nozzle 120 is displaceable relative to rotational axis A along at least one axis D, E, F by way of a nozzle actuator (not depicted), which may be a servo, stepper motor, or the like.

Apparatus 201 further includes a tiltable chuck 210. Apparatus 201 may include one or more component configured to provide a mechanical coupling operable to tilt chuck 210 about an inclination axis B to a non-zero angle of elevation or inclination θ. Rotational axis A as aligned with the z-axis is plumb (parallel to the direction gravity) when the angle of inclination θ=0. In this first state, chuck 210 is represented by solid line in FIG. 2. Rotational axis A tilts out of plumb when the angle of inclination θ>0. In this second state, chuck 210 rotates about tilted rotational axis A', and is represented by dashed line in FIG. 2. With non-zero tilt, the chuck surface upon which workpiece 105 is disposed is taken out of level by the inclination angle θ. In accordance with some exemplary embodiments, the angle of inclination θ is relatively small. For example, the angle of inclination θ may be less than 10°, advantageously between 1° and 5°, and more advantageously between 1° and 3°. With these relatively small inclination angles, lateral loading upon drive shaft 215 and other components enabling the chuck rotation can be expected to be relatively minor. A significant redesign of workpiece clamping may also be unnecessary. Nevertheless, simulations have shown inclination angles of this magnitude impart a sufficient non-radially symmetric force through the action of gravity on plating fluid 125 to improve residence time uniformity. For example, plating liquid edge 232 is shown in dashed line as a comparison to puddle edge 131 associated with a dispense on a level chuck.

Chuck tilt may be controlled by a variety of components and/or assemblages suitable for chuck level control. For example, chuck 210, and/or drive shaft 215, and/or a yoke or other support thereof may be tilted by one or more linear actuators. Exemplary linear actuators include, but art not limited to, voice coil motors, pneumatic actuators, and lead screw drives. One or more such actuators may provide a mechanical coupling between the plating tool chassis and chuck 210, and/or drive shaft 215, and/or support thereof. One or more such actuators may also provide a mechanical coupling between the plating tool chassis and an external floor supporting or suspending the chassis. However, chassis chuck level control is advantageously independent of plating tool chassis level controls (e.g., chassis leveling feet). Chuck 210, and/or drive shaft 215, and/or support thereof may also be placed on a gimbal with the gimbal axis defining inclination axis B. A gimbal motor, such as any known stepper motor may, be employed to control the inclination angle.

Any other component or assembly known in the art to be suitable for purposes with the scope of the present invention may also be employed.

In some embodiments, chuck tilt on a EL plating tool is actively controlled. Such active chuck level control may modulate the chuck tilt magnitude and/or orientation before, during, or after dispense of the EL plating fluid onto the workpiece. Active chuck level control may be computer-controlled to be dynamic between multiple chuck leveling states, such as a level state (e.g., rotational axis plumb) advantageous for workpiece transfers to and from the chuck, and a non-level state (e.g., rotational axis tilted off plumb) advantageous for rapid surface wetting. Computer control of an active chuck level may further be configured to move the chuck between multiple non-level states (e.g., different magnitudes of chuck tilt). Computerized active chuck level control may be centralized to a computer platform responsible for controlling other plating process recipe control parameters, such as chuck rotation rate, nozzle position, and fluid flow rate. As such, the chuck angle of inclination may be further defined as a plating process recipe parameter in substantially the same manner as fluid flow rate, nozzle position, and rotational rate. The parameter set points may then be computer controlled as function of time and/or recipe step.

In the exemplary embodiment illustrated in FIG. 2, apparatus 201 further includes a computerized plating tool controller 240 communicatively coupled drive shaft 215, the actuator of dispense nozzle 120, and flow rate control of liquid delivery system 228. Controller 240 may be any fixed function or field programmable computer platform, for example as further described elsewhere herein. While controller 240 is shown as a centralized computer platform communicatively coupled to each of drive shaft 215, the actuator of dispense nozzle 120, and flow rate control of liquid delivery system 228, separate discrete microcontrollers may be employed to the same effect. In some advantageous embodiments, controller 240 is to send commands to the chuck level control by way of digital or analog signals to cause the chuck level control to achieve a non-zero angle of inclination θ at some point during a plating fluid dispense cycle. In some advantageous embodiments, controller 240 is to send commands by way of digital or analog signals to control each of the chuck rotation speed, plating liquid flow rate from nozzle 125, and position of nozzle 125 during the dispense cycle.

Figure 3A:
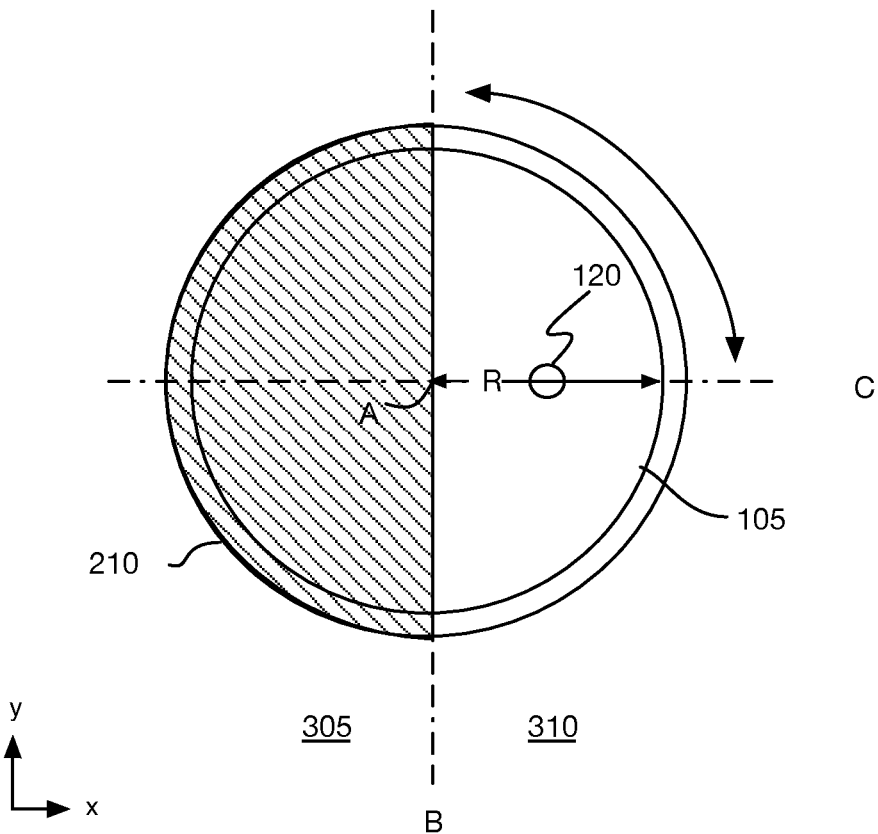
FIG. 3A is a plan view of the tiltable workpiece chuck employed in the plating apparatus illustrated in FIG. 2, in accordance with some embodiments.

In exemplary embodiments, the angle of inclination θ is positive along a radius of the chuck travelled by the fluid dispense nozzle. In other words, the chuck is to tilt in relation to the fluid dispense nozzle such that the nozzle is positioned over a high side of the chuck during at least a portion of the fluid dispense cycle. FIG. 3A is a plan view of the tiltable workpiece chuck 210, in accordance with some such embodiments. In FIG. 3A, field lines shade the low side of chuck 210 to the left of inclination axis B, and the high side of chuck 210 to the right of inclination axis B. As shown, fluid dispense nozzle 120 is disposed over the unshaded high side of chuck 210 during at least a portion of the plating liquid dispense. In some advantageous embodiments, the chuck inclination axis is oriented substantially normal (orthogonal) to a ray extending between the nozzle dispense position and the rotational axis. In some embodiments in accordance with FIG. 3A, for example, dispense nozzle 120 is positioned at one or more locations long the radius R of workpiece 105 while dispensing the plating solution. As shown, radius R extends from the rotational axis A to an edge of workpiece 105 (e.g., ~150-200 mm for a 300-400 mm diameter semiconductor wafer). The chuck inclination axis B is oriented substantially normal to axis C, which radius R overlies. Hence, for some embodiments where dispense nozzle 120 is scanned along at least a portion of radius R during the liquid dispense, inclination axis B is oriented substantially normal to the radial scanning direction. The radial scanning distance may vary with the dimensions of the workpiece. For example 70-145 mm from the rotational axis being an exemplary range for a 300 mm diameter semiconductor wafer. Notably however, chuck inclination axis B need not be normal to the path of dispense nozzle travel. For some nozzle scans, the angle between inclination axis B and nozzle path will change with time as the nozzle travels to different locations on the path.

Figure 3B:
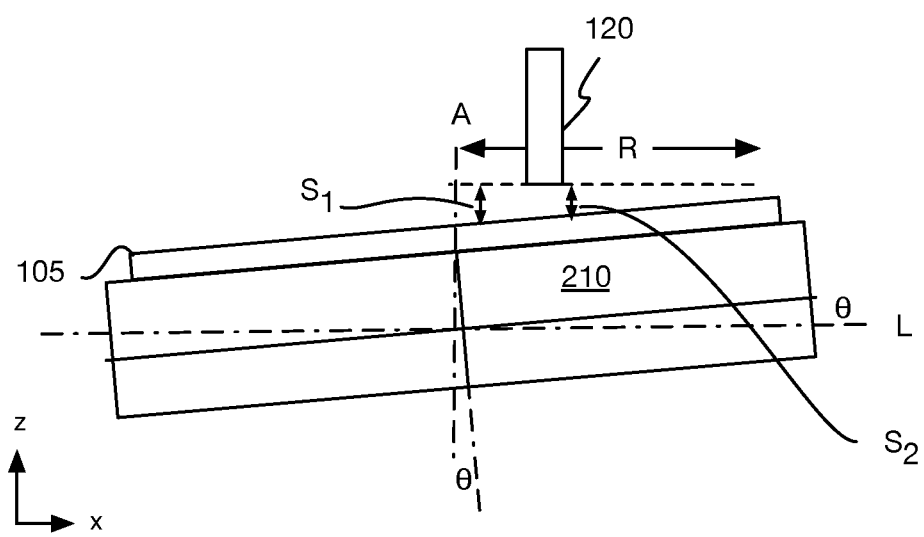
FIG. 3B is a cross-section view of the tiltable workpiece chuck employed in the plating apparatus illustrated in FIG. 2, in accordance with some embodiments.

FIG. 3B is a cross-sectional view of the tiltable workpiece chuck 210, in accordance with some embodiments taking along a plane coincident with axis C in FIG. 2. Here, the positive inclination angle θ is shown relative to level line L and plumb rotational axis A. For some embodiments where nozzle 120 is scanned in a level path independent of chuck tilt, free space between nozzle 120 and a surface of workpiece 105 to be wetted varies from a larger space $S_1$ proximal to the rotational axis A to a smaller space $S_2$ proximal to an edge of workpiece 105 while the chuck is non-level. In some alternative embodiments where nozzle 120 is coupled to a common tiltable support shared with chuck 210, the nozzle path may be inclined by substantially the same magnitude as the chuck. For such embodiments, nozzle 120 is scanned in a level path dependent on chuck tilt, with the free space between nozzle 120 and a surface of workpiece 105 to be wetted remaining constant even when the chuck is non-level (i.e., $S_1=S_2$).

Figure 4:
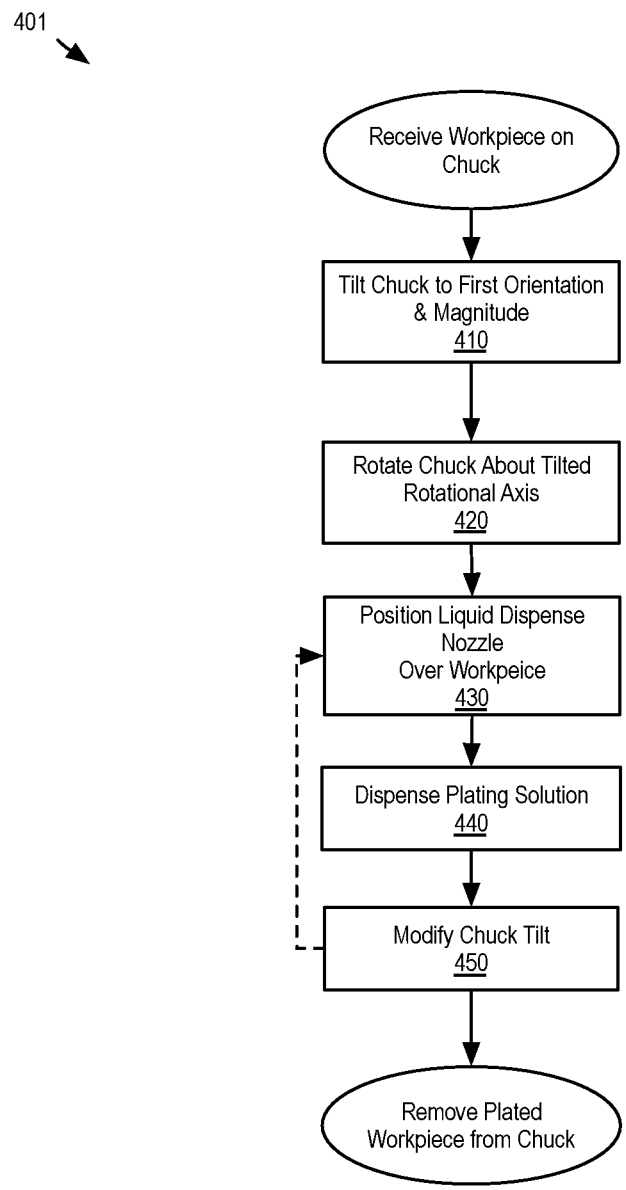
FIG. 4 is a flow diagram illustrating a method of plating a workpiece, in accordance with some embodiments.

FIG. 4 is a flow diagram illustrating a method 401 for plating a workpiece, in accordance with some embodiments. Method 401 begins with receiving a workpiece on a support surface of the chuck. In exemplary embodiments, the workpiece is a semiconductor wafer, such as a 300-400 mm diameter wafer. Other disk-shaped workpieces known in the art may also be suitable. In some specific examples, the semiconductor wafer surface has topography that is to be filled with the material to be plated during method 401. Any known robotic transfer may be employed to handle and center the workpiece with the chuck. Any known technique may be employed to hold the workpiece to the chuck, such as, but not limited to a gravity mount, vacuum mount, or electrostatic mount. Advantageously, during workpiece transfer, the chuck is in a level state with the rotational axis (A in FIG. 2) plumb. A level chuck state may assist with accurate transfers to the chuck, for example ensuring proper centering of the workpiece with the chuck's rotational axis.

At operation 410, the chuck is tilted while the workpiece is mounted to the chuck to a first non-level position associated with a first angle of inclination (magnitude) and first inclination orientation. As noted above in FIG. 3A, inclination orientation defines the azimuthal position of inclination axis B with respect to where the dispense nozzle 120 is to be positioned. In some embodiments, at operation 410 the chuck is tilted to 1-10° and advantageously 1-5°, and more advantageously than 1-3°. In some embodiments, the inclination axis at operation 410 is oriented substantially normal to a ray extending between the nozzle dispense position and the rotational axis.

At operation 420, the chuck is rotated about the rotational axis at a predetermined rotational rate. In some exemplary embodiments, the rotation rate at operation 420 is less than 30 RPM and advantageously between 1 and 10 RPM. Notably, the sequence of operations 410 and 420 may be varied. For example, chuck rotation may commence before or after the chuck is tilted off level.

At operation 430, the plating fluid dispense nozzle(s) is positioned over the workpiece at a predetermined initial location relative to the orientation of the chuck inclination axis. In some embodiments, at operation 430 a fluid dispense nozzle is positioned at first location along the radius of the workpiece. For example the first position may be proximal to the edge of the workpiece or proximal to the rotational axis.

At operation 440, the plating liquid dispense is commenced, for example by controlling a metering pump of the liquid delivery system to a predetermined non-zero flow rate. The plating liquid may be any known to be suitable for plating the desired material onto the workpiece. The material to be plated may be any known, such as, but not limited to a metal which can autocatalyze a reducing deposition, such as iron, cobalt, nickel, palladium, platinum, and alloys thereof. In some embodiments, the plating liquid is an aqueous solution of a metal complexing agent, and may further comprise reducing agents such as, but not limited to, thiosulfates, hydrazine, or hydrated sodium hypophosphite ($NaPO_2H_2 \cdot H_2O$). The liquid dispense is commenced while the chuck is tilted at the first angle of inclination defined at operation 410 and rotating at the rotational rate defined at operation 420. In some embodiments, at least one of nozzle position, chuck tilt, and rotation rate are modulated while plating liquid dispense is occurring. For example, method 401 may return to nozzle positioning operation 430 to displace the nozzle to another location over the workpiece while the plating liquid continues to dispense. In some embodiments, the nozzle is positioned at multiple locations along the radius of the substrate while dispensing the plating solution. In some further embodiments, the dispense nozzle positioning operation 430 is repeated to radially scan the nozzle along at least a portion of the radius of the substrate while dispensing the plating solution at operation 440.

At operation 450 chuck tilt magnitude and/or orientation is modified from the first orientation and/or first magnitude defined at operation 410. In some embodiments, operation 450 is performed only after cessation of the plating liquid dispense. In that case, the non-zero first chuck tilt defined at operation 410 is constant throughout the plating liquid dispense and operation 450 is performed to return the chuck to the zero tilt (level) state. A puddle of plating fluid may be maintained on the workpiece while in this condition for a remainder of the plating process time, or the plating fluid may be rinsed off prior to returning the chuck to the level state at operation 450. The chuck may be returned to level at operation 450 prior to removing the plated workpiece from the chuck at the completion of method 401.

Figure 5:
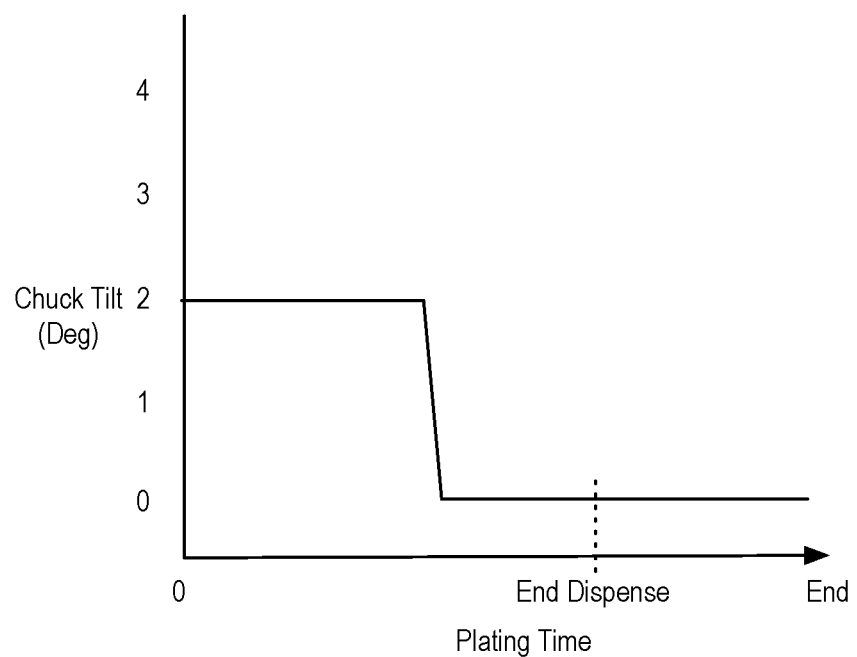
FIG. 5 is a graph illustrating a modulation of workpiece tilt during plating dispense.

In some other embodiments, operation 450 is performed prior to cessation of the plating liquid dispense. In that case, the magnitude or orientation of the non-zero chuck tilt is modified one or more times during the plating liquid dispense. FIG. 5 is a graph illustrating a modulation of workpiece tilt during plating dispense. Plating time is on the x-axis and the magnitude of chuck tilt is on the y-axis. As shown, at plating time 0 when plating liquid dispense commences, chuck tilt is at a first, larger magnitude (e.g., 2°). Dispense may continue (e.g., for some predetermined duration) at one or more nozzle position and chuck rotation rate, and then tilt is reduced to a second magnitude (e.g., 0°). Plating liquid dispense continues (e.g., for another predetermined duration) at one or more nozzle position and chuck rotation rate, and then plating liquid dispense ends. Plating time may continue for some additional time until the plating liquid puddle is removed (e.g., rinsed) from the workpiece to end the plating process. Tilt orientation may also be modulated, for example azimuthally rotating the inclination axis (e.g., the angle between inclination axis B and ray C in FIG. 3A is modified). Such modulation may vary the inclination axis between 90° and 0° of the radius over which the dispense nozzle is scanned during plating liquid dispense.

Figure 6:
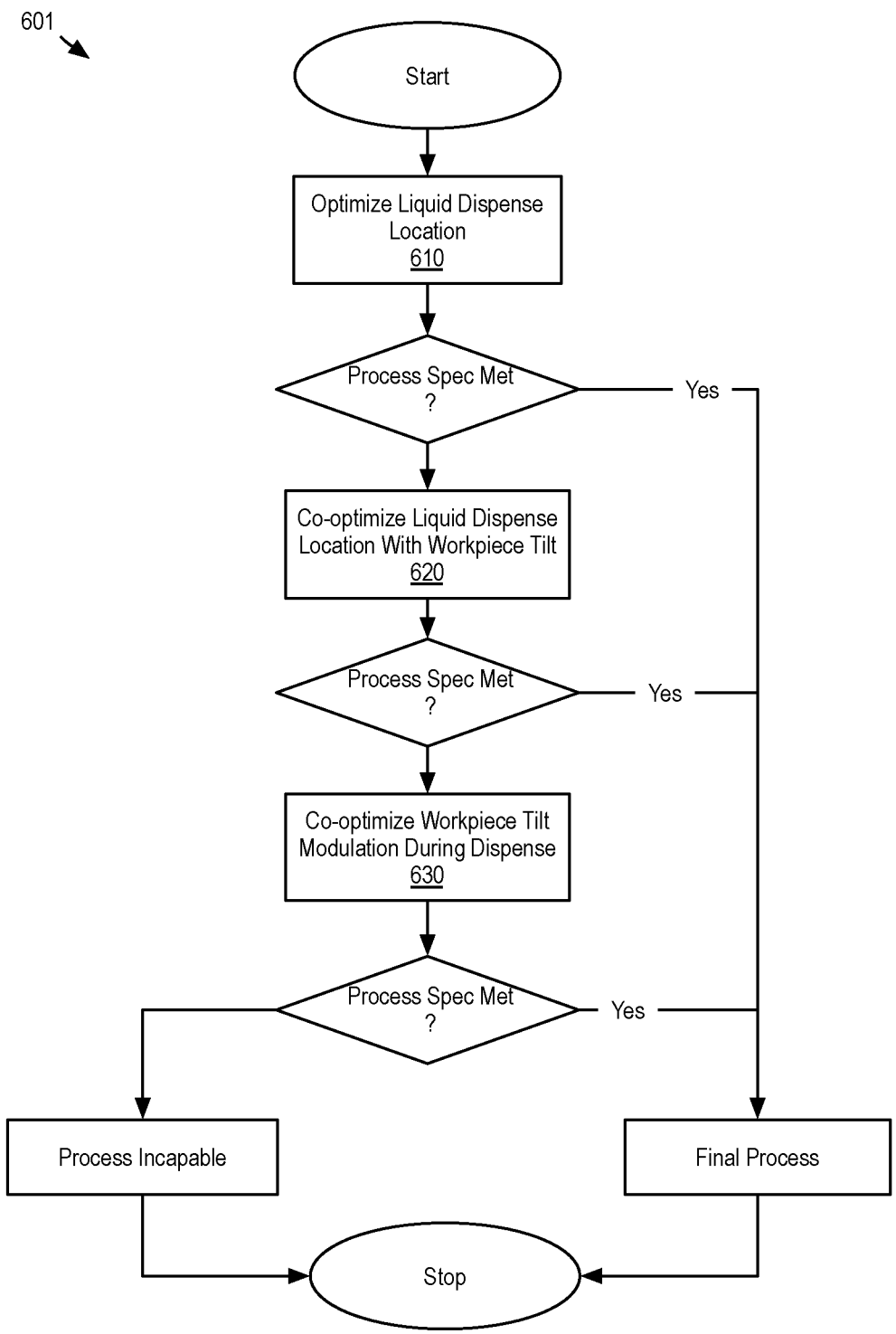
FIG. 6 is a flow diagram illustrating multi-variable plating process optimization, in accordance with some embodiments.

FIG. 6 is a flow diagram illustrating multi-variable plating process optimization method 601, in accordance with some embodiments. Method 601 may be performed with chuck rotation rate and plating liquid flow rate held constant at predetermined values. As shown, EL plating optimization begins with optimization of the liquid dispense location at operation 610. Such optimization may be performed based on numerical simulation or empirical data to determine one or more positions to locate the dispense nozzle during plating liquid dispense. For example, an optimal radial scan length may be determined. Uniformity of the plated material thickness or plating liquid residence time across the workpiece surface may be the response variable for optimization operation 610. If sufficient uniformity is achieved, method 601 may end with a process recipe that does not employ chuck tilt. If instead the plating process specifications are not met, method 601 continues with co-optimization of the liquid dispense location and non-zero workpiece (chuck) tilt. At operation 620, various magnitudes and orientations of chuck tilt may be tested in conjunction with one or more nozzle positions (e.g., radial scan lengths). Such optimization may again be performed base on numerical simulation or empirical data to determine a non-zero chuck tilt and one or more positions to locate the dispense nozzle during plating liquid dispense. For example, an optimal radial scan length may be determined for an optimal non-zero tilt. Uniformity of the plated material thickness or plating liquid residence time across the workpiece surface may be the response variable for optimization operation 620. If sufficient uniformity is achieved, method 601 may end with a process recipe that employs a fixed non-zero chuck tilt. If instead the plating process specifications are not met, method 601 continues with co-optimization of the liquid dispense location and non-zero workpiece (chuck) tilt modulation. At operation 630, magnitudes and orientations of chuck tilt and changes in the chuck tilt may be tested in conjunction with one or more nozzle positions (e.g., radial scan lengths). Such optimization may again be performed based on numerical simulation or empirical data to determine how to modulate the non-zero chuck tilt while locating the dispense nozzle during plating liquid dispense. For example, an optimal chuck tilt magnitude and/or orientation modulation over an optimal radial scan length may be determined. Uniformity of the plated material thickness or plating liquid residence time across the workpiece surface may be the response variable for optimization operation 630. If sufficient uniformity is achieved, method 601 may end with a process recipe that employs a modulated non-zero chuck tilt during the plating liquid dispense. If instead the plating process specifications are not met, method 601 ends with the plating tool deemed incapable of performing the plating process within the desired specifications.

Figure 7:
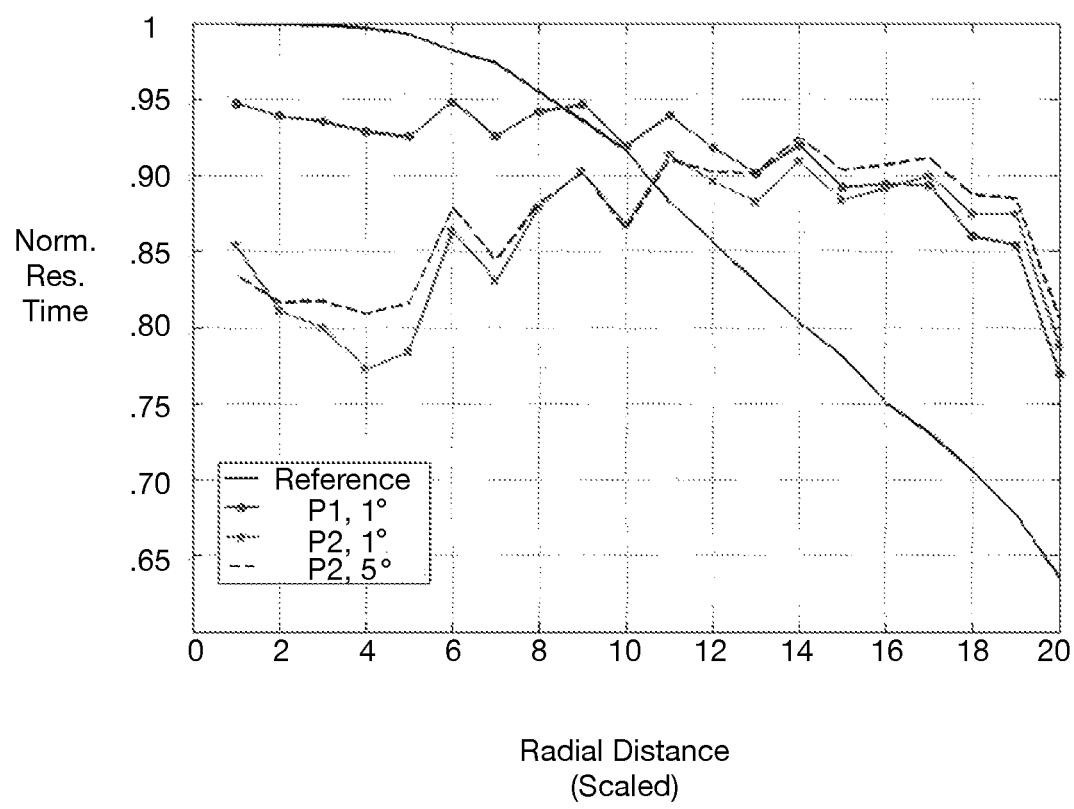
FIG. 7 is a graph illustrating normalized residence time of plating solution on a workpiece surface as a function of radial distance from the chuck rotational axis, in accordance with some embodiments.

FIG. 7 is a graph illustrating normalized residence time of plating solution on a workpiece surface as a function of radial distance from the chuck rotational axis, in accordance with some embodiments. In FIG. 7, normalized residence time is plotted on the y-axis and radial distance from the rotational axis is plotted on the x-axis. The solid line is plotted for a reference plating process employing a reference rotation rate, reference plating liquid dispense flow rate, a level chuck, and a fixed nozzle position located at the rotation axis. As shown, the residence time of the plating liquid monotonically drops by nearly 50% from center to the edge position at scaled radial distance of 18. The solid line with dot markers is plotted for a reference plating process employing the reference rotation rate and reference plating liquid dispense flow rate. However, the chuck is tilted at 1°, and nozzle position scanned over a first radial distance P1. As shown, the residence time of the plating liquid monotonically drops by less than 10% from center to the edge position at scaled radial distance of 18. The solid line with star markers is plotted for a plating process employing the reference rotation rate and reference plating liquid dispense flow rate, and the chuck is again tilted at 1°. For this treatment, nozzle position scanned over a second (e.g., greater) radial distance P2. As shown, the residence time of the plating liquid no longer monotonically decreases. Instead first decrease ~5% before increasing ~10% from center to ½ radius position and then decreasing ~5% from the ½ radius position to the edge position at scaled radial distance of 18. The dashed line is plotted for a plating process employing the reference rotation rate and reference plating liquid dispense flow rate. For this treatment, the nozzle position is again scanned over the second radial distance P2, but the chuck is tilted at 5°. As shown, the residence time of the plating liquid decreases by less than 5% before increasing 5-10% from center to ½ radius position, and then decreasing 5-10% from the ½ radius position to the edge position at scaled radial distance of 18. As such, the greater tilt appears to counter some of the loss in residence time at lower radial distances that is associated with scanning the dispense nozzle in a manner that significantly increases the residence time at greater radial distances. As such, it can be seen that non-zero chuck tilt control can be advantageously combined with non-zero (fixed) nozzle position control.

Figure 8:
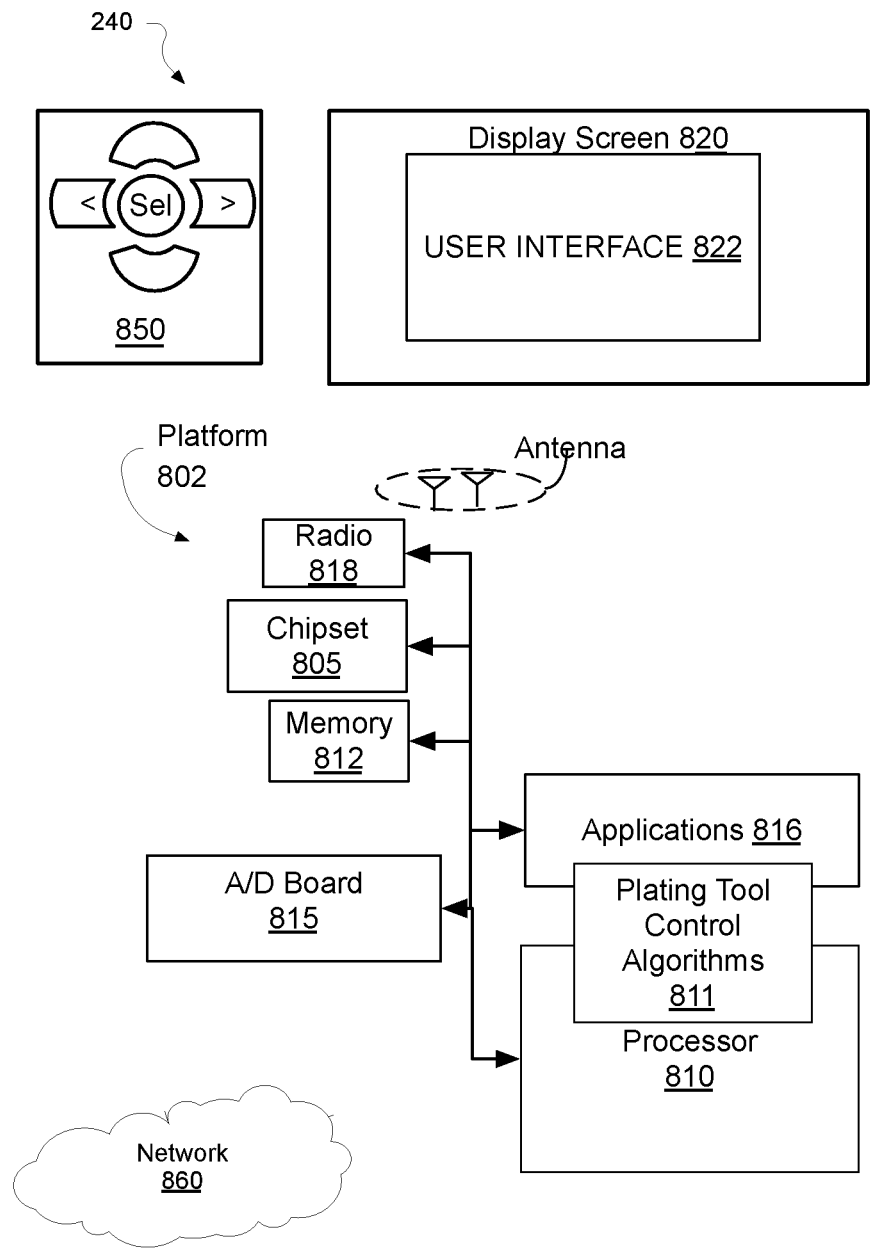
FIG. 8 is a block diagram of a controller employed in the plating apparatus illustrated in FIG. 2, in accordance with some embodiments.

FIG. 8 is a block diagram of controller 240 employed in the plating apparatus illustrated in FIG. 2, in accordance with some embodiments. Controller 240 may cause a chuck level control to enter one or more non-level state from a level state, in accordance with one or more embodiment. Controller 240 may be a mobile device although it is not limited in this context as controller 240 may also be embedded within a EL plating tool chassis. Controller 240 may be incorporated into a laptop computer, tablet, touch pad, handheld computer, palmtop computer, cellular telephone, smart device (e.g., smart phone, smart tablet or mobile television), mobile internet device (MID), and so forth.

Controller 240 includes a device platform 802 that may implement all or a subset of the various chuck tilting functions and EL plating methods described above in the context of FIG. 2-7. In various exemplary embodiments, microprocessor 810 executes at least one of chuck inclination commands, dispense nozzle actuation commands, chuck rotation commands, and plating liquid dispense commands, for example as described above. Microprocessor 810 fixed or programmable logic circuitry dictating chuck level control commands through A/D board 815, for example as described elsewhere herein. In some embodiments, one or more computer readable media may store instructions, which when executed by processor 810, cause the processor(s) to execute one or more EL plating process recipe algorithms 811 including non-zero chuck tilting, such as any of those methods described in detail above. For example, a machine-readable medium may include read only memory (ROM); random access memory (RAM); magnetic disk storage media; optical storage media; flash memory devices; magnetic, electrical, optical, acoustical, or other similarly non-transitory, tangible media.

In embodiments, device platform 802 is coupled to a human interface device (HID) 820. Platform A navigation controller 850 including one or more navigation features may be used to interact with, for example, device platform 802 and/or HID 820. In embodiments, HID 820 may include any television type monitor or display coupled to platform 802 via radio 818 and/or network 860. HID 820 may include, for example, a computer display screen, touch screen display, video monitor, or television-like device, and may be further capable of receiving touch inputs through user interface 822 while an image is displayed on HID 820.

In embodiments, device platform 802 may include a chipset 805, processor 810, memory/storage 812, applications 816, radio 818, and A/D (D/A) board 815. Chipset 805 may provide intercommunication among processor 810, memory 812, A/D board 815, and radio 818. Processor 810 may be implemented as one or more Complex Instruction Set Computer (CISC) or Reduced Instruction Set Computer (RISC) processors; x86 instruction set compatible processors, multi-core, or other microprocessor or central processing unit (CPU) including programmable registers. Memory 812 may be implemented as a volatile memory device such as, but not limited to, a Random Access Memory (RAM), Dynamic Random Access Memory (DRAM), or Static RAM (SRAM). Memory 812 may also be implemented as a non-volatile storage device such as, but not limited to flash memory, battery backed-up SDRAM (synchronous DRAM), magnetic memory, phase change memory, and the like. A/D board 815 may include any A/D conversion needed to cause chuck tilt control to move between level and non-level states. Radio 818 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, radio 818 may operate in accordance with one or more applicable standards.

In embodiments, controller 240 may be implemented as a wireless system, a wired system, or a combination of both. When implemented as a wireless system, controller 240 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, controller 240 may include components and interfaces suitable for communicating over wired communications media, such as input/output (I/O) adapters, physical connectors to connect the I/O adapter with a corresponding wired communications medium, a network interface card (NIC), disc controller, video controller, audio controller, A/D convertor, and the like. Examples of wired communications media may include a wire, cable, metal leads, printed circuit board (PCB), backplane, switch fabric, semiconductor material, twisted-pair wire, co-axial cable, fiber optics, and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments described above, but can be practiced with modification and alteration without departing from the scope of the appended claims. For example, the above embodiments may include specific combinations of features as further provided below.

In one or more first embodiments, an electroless plating apparatus comprises a workpiece chuck to support a workpiece comprising a semiconductor wafer during a plating process, a drive shaft motor to rotate the chuck about a rotational axis, a liquid delivery system to dispense plating solution through the nozzle, a dispense nozzle actuator to position the nozzle over the chuck, an active chuck level to tilt the rotational axis of rotation, and a controller communicatively coupled to at least the dispense nozzle actuator and the active chuck level.

In one or more second embodiments, the controller in any of the first embodiments is to cause the active chuck level to incline the chuck to a positive angle of inclination along a radius of the chuck originating at the rotational axis, and cause the dispense nozzle actuator to position the nozzle over a high side of the of chuck while causing the liquid delivery system to dispense the plating solution onto the workpiece.

In one or more third embodiments, the controller in any of the first or second embodiments is to cause the dispense nozzle actuator to radially scan the nozzle along at least a portion of the radius of the workpiece while the liquid delivery system is controlled to dispense the plating solution, and the inclination axis is oriented substantially normal to the radial scanning direction.

In one or more fourth embodiments, the controller in any of the first, second, or third embodiments is to cause the active chuck level to incline the chuck at an angle of inclination less than 5° from level.

In one or more fifth embodiments, for any of the first, second, third, or fourth embodiments, the angle of inclination is between 1° and 3° from level.

In one or more sixth embodiments, the controller in any of the first, second, third, fourth or fifth embodiments is to cause the drive shaft motor to rotate the chuck at rate below 30 RPM while tilting the rotational axis.

In one or more seventh embodiments, the controller in any of the first, second, third, fourth, fifth or sixth embodiments is to cause the active chuck level to modify a magnitude or orientation of the tilt after the dispensing has begun.

In one or more eighth embodiments, the controller in any of the first, second, third, fourth, fifth, sixth, or seventh embodiments is to cause the active chuck level to tilt at a first angle of inclination, cause the liquid delivery system to begin dispensing the plating solution while at the chuck is at the first angle of inclination, cause the active chuck level to reduce the magnitude of tilt to a second angle of inclination, and cause the liquid delivery system to cease dispensing the plating solution while at the chuck is at the second angle of inclination.

In one or more ninth embodiments, the first angle of inclination for any of the eighth embodiments is between 1° and 3° from level and the second angle of inclination for any of the eighth embodiments is less than 1°.

In one or more tenth embodiments, for any of the first, second third, fourth, fifth, sixth, seventh, eighth, or ninth embodiments, the active chuck level comprises at least one of: a gimbal, a drive motor, a linear actuator, and a lead screw.

In one or more eleventh embodiments, the active chuck level comprises the gimbal in any of the tenth embodiments with an axis coupled to the drive motor, or the active chuck level comprises the linear actuator in any of the tenth embodiments coupled to the chuck or a support thereof.

In one or more twelfth embodiments, a method of electroless plating comprises placing a workpiece comprising a semiconductor wafer on a chuck, rotating the chuck about a rotational axis, tilting the rotational axis of rotation, positioning a dispense nozzle over the workpiece, dispensing an electroless plating solution from the nozzle while rotating and tilting the chuck, and removing the workpiece from the chuck after a material is plated from the solution onto a surface of the workpiece.

In one or more thirteenth embodiments, for any of the twelfth embodiments tilting the rotational axis inclines the chuck to a positive angle of inclination along a radius of the chuck originating at the rotational axis, and positioning the dispense nozzle locates the nozzle over a high side of the of chuck while dispensing the plating solution.

In one or more fourteenth embodiments, for the method in any of the twelfth or thirteenth embodiments, positioning the dispense nozzle over the workpiece further comprises positioning the nozzle at one or more locations along the radius of the workpiece while dispensing the plating solution, and tilting the rotational axis further comprises tilting the rotational axis about an inclination axis that is oriented substantially normal to a ray extending between the nozzle dispense position and the rotational axis.

In one or more fifteenth embodiments, for the method in any of the twelfth, thirteenth or fourteenth embodiments, positioning the dispense nozzle over the workpiece further comprises radially scanning the nozzle along at least a portion of the radius of the workpiece while dispensing the plating solution, and the inclination axis is oriented substantially normal to the radial scanning direction.

In one or more sixteenth embodiments, for the method in any of the twelfth, thirteenth, fourteenth or fifteenth embodiments, the angle of inclination is less than 5° from level.

In one or more seventeenth embodiments, for the method in any of the twelfth, thirteenth, fourteenth, fifteenth or sixteenth embodiments, the angle of inclination is between 1° and 3° from level.

In one or more eighteenth embodiments, for the method in any of the twelfth, thirteenth, fourteenth, fifteenth, sixteenth, or seventeenth embodiments, rotating the chuck further comprises a rotating at rate below 30 RPM.

In one or more nineteenth embodiments, for the method in any of the twelfth, thirteenth, fourteenth, fifteenth, sixteenth, seventeenth, or eighteenth embodiments, tilting the rotational axis further comprises modifying a magnitude or orientation of the tilt after positioning the workpiece on the chuck.

In one or more twentieth embodiments, for the method in any of the twelfth, thirteenth, fourteenth, fifteenth, sixteenth, seventeenth, eighteenth, or nineteenth embodiments, modifying the magnitude or orientation of the tilt further comprises at least one of increasing the tilt after the workpiece is positioned on the chuck, but before the dispensing commences, and reducing the tilt after the dispensing commences.

In one or more twenty-first embodiments, for the method in any of the twelfth, thirteenth, fourteenth, fifteenth, sixteenth, seventeenth, eighteenth, nineteenth, or twentieth embodiments, modifying the magnitude of the tilt further comprises reducing the tilt while dispensing the plating solution.

In one or more twenty-second embodiments, for the method in any of the twelfth, thirteenth, fourteenth, fifteenth, sixteenth, seventeenth, eighteenth, nineteenth, twentieth, or twenty-first embodiments, the plating solution plates at least one of Ni, Au, or Pt.

In one or more twenty-third embodiments, a non-transitory computer readable media has instructions stored thereon, which when executed by a computer processor cause the processor to perform a method comprising placing a workpiece on a chuck, the workpiece comprising a semiconductor wafer, rotating the chuck about a rotational axis, tilting the rotational axis of rotation, positioning a dispense nozzle over the workpiece, dispensing an electroless plating solution from the nozzle while rotating and tilting the chuck, and removing the workpiece from the chuck after a material is plated from the solution onto a surface of the workpiece.

In one or more twenty-fourth embodiments, the media in any of the twenty-third embodiments has instructions stored thereon, which when executed by a computer processor cause the processor to perform a method comprising positioning the dispense nozzle over the workpiece further comprises positioning the nozzle at one or more location along the radius of the workpiece while dispensing the plating solution, and tilting the rotational axis further comprises tilting the rotational axis about an inclination axis that is oriented substantially normal to a ray extending between the nozzle dispense position and the rotational axis.

In one or more twenty-fifth embodiments, a computer readable media has instructions stored thereon, which when executed by a computer processor cause the processor to perform any of the methods recited in any of the methods in the twelfth, thirteenth, fourteenth, fifteenth, sixteenth, seventeenth, eighteenth, nineteenth, twentieth, twenty-first, or twenty-second embodiments.

In one or more twenty-sixth embodiments, an electroless plating apparatus includes a support means to support a workpiece comprising a semiconductor wafer during a plating process, a drive means to rotate the support means about a rotational axis, a liquid delivery means to dispense plating solution through the nozzle, a nozzle actuation means to position the nozzle over the chuck, an active leveling means to tilt the rotational axis of rotation, and a control means communicatively coupled to at least the nozzle actuation means and the active leveling means.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims.

What is claimed is:
1. A plating apparatus, comprising:
a chuck to support a workpiece comprising a semiconductor wafer during a plating process;
a drive shaft motor to rotate the chuck about a rotational axis during the plating process;
a liquid delivery system to dispense a plating solution through a dispense nozzle during the plating process;
a dispense nozzle actuator to position the dispense nozzle over the chuck during the plating process;

an active chuck level to tilt the rotational axis during the plating process to a non-zero angle of inclination less than 10° from a direction of gravity; and a controller communicatively coupled to at least the dispense nozzle actuator and the active chuck level, wherein the controller is configured to form, during the plating process, a puddle of the plating solution on a surface of the workpiece by:

causing the active chuck level to incline the chuck from level according to the non-zero angle of inclination; and causing the dispense nozzle actuator to position the dispense nozzle over the inclined chuck while the liquid delivery system dispenses the plating solution onto the workpiece as the chuck is rotated about the rotational axis.

2. The apparatus of claim 1, wherein the controller is configured to:

cause the dispense nozzle actuator to position the dispense nozzle over a high side of the inclined chuck while causing the liquid delivery system to dispense the plating solution onto the workpiece.

3. The apparatus of claim 1, wherein the controller is configured to:

cause the dispense nozzle actuator to radially scan the dispense nozzle along at least a portion of the radius of the wafer while the liquid delivery system is controlled to dispense the plating solution and an inclination axis is oriented substantially normal to the radial scanning direction.

4. The apparatus of claim 1, wherein the non-zero angle of inclination is less than 5° from the direction of gravity.

5. The apparatus of claim 4, wherein the non-zero angle of inclination is between 1° and 3° from the direction of gravity.

6. The apparatus of claim 1, wherein the controller is configured to cause the drive shaft motor to rotate the chuck at rate below 30 RPM while tilting the rotational axis.

7. The apparatus of claim 1, wherein the controller is configured to cause the active chuck level to modify a magnitude or orientation of the tilt after the dispensing has begun.

8. The apparatus of claim 7, wherein the controller is configured to:

cause the active chuck level to tilt at a first angle of inclination;

cause the liquid delivery system to begin dispensing the plating solution while at the chuck is at the first angle of inclination;

cause the active chuck level to reduce the magnitude of tilt to a second angle of inclination; and cause the liquid delivery system to cease dispensing the plating solution while at the chuck is at the second angle of inclination.

9. The apparatus of claim 8, wherein the first angle of inclination is between 1° and 3° from the direction of gravity and the second angle of inclination is less than 1°.

10. The plating apparatus of claim 1, wherein the active chuck level comprises at least one of: a gimbal, a drive motor, a linear actuator, and a lead screw.

11. The apparatus of claim 10, wherein:

the active chuck level comprises the gimbal with an axis coupled to the drive motor; or the active chuck level comprises the linear actuator coupled to the chuck or a support thereof.

12. A method of plating, comprising:

placing a workpiece on the chuck of claim 1, the workpiece comprising a semiconductor wafer;

rotating the chuck about the rotational axis;

positioning the dispense nozzle over the workpiece;

dispensing the plating solution from the dispense nozzle while rotating and tilting the chuck according to the non-zero angle of inclination; and removing the workpiece from the chuck after a material is plated from the solution onto a surface of the workpiece.

13. The method of claim 12, wherein:

positioning the dispense nozzle locates the dispense nozzle over a high side of the chuck while dispensing the plating solution.

14. The method of claim 13, wherein:

positioning the dispense nozzle over the workpiece further comprises positioning the dispense nozzle at one or more locations along the radius of the workpiece while dispensing the plating solution; and tilting the rotational axis further comprises tilting the rotational axis about an inclination axis that is oriented substantially normal to a ray extending between a nozzle dispense position and the rotational axis.

15. The method of claim 14, wherein:

positioning the dispense nozzle over the workpiece further comprises radially scanning the dispense nozzle along at least a portion of the radius of the workpiece while dispensing the plating solution; and the inclination axis is oriented substantially normal to the radial scanning direction.

16. The method of claim 13, wherein the non-zero angle of inclination is less than 5° from the direction of gravity.

17. The method of claim 16, wherein the non-zero angle of inclination is between 1° and 3° from the direction of gravity.

18. The method of claim 12, wherein rotating the chuck further comprises a rotating at rate below 30 RPM.

19. The method of claim 12, wherein tilting the rotational axis further comprises modifying a magnitude or orientation of the tilt after positioning the workpiece on the chuck.

* * * * *